US010244652B1

(12) United States Patent
Czamara et al.

(10) Patent No.: US 10,244,652 B1
(45) Date of Patent: Mar. 26, 2019

(54) CONFIGURABLE SERVER COMPONENTS

(71) Applicant: Amazon Technologies, Inc., Seattle, WA (US)

(72) Inventors: Michael P. Czamara, Seattle, WA (US); Brock Robert Gardner, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/276,706

(22) Filed: Sep. 26, 2016

(51) Int. Cl.
*H05K 7/14* (2006.01)
*H05K 7/20* (2006.01)

(52) U.S. Cl.
CPC ......... *H05K 7/1497* (2013.01); *H05K 7/1489* (2013.01); *H05K 7/1492* (2013.01); *H05K 7/20709* (2013.01)

(58) Field of Classification Search
CPC .. H05K 7/1497; H05K 7/1489; H05K 7/1492; H05K 7/20709
See application file for complete search history.

(56) References Cited

U.S. PATENT DOCUMENTS

| | | | | |
|---|---|---|---|---|
| 8,327,589 B2* | 12/2012 | Sutton | ............... | A47B 46/005 52/27 |
| 8,477,491 B1* | 7/2013 | Ross | ............... | H05K 7/20736 361/679.48 |
| 8,582,299 B1* | 11/2013 | Phillips | ............... | H05K 7/1489 361/724 |
| 9,198,310 B2* | 11/2015 | Eichelberg | ............... | H05K 7/20745 |
| 2005/0050185 A1* | 3/2005 | King | ............... | H04L 63/0428 709/223 |
| 2009/0263992 A1* | 10/2009 | Dittus | ............... | H05K 7/1492 439/110 |
| 2010/0300999 A1* | 12/2010 | Schwartzkopf | ............... | A47B 96/061 211/104 |
| 2011/0189936 A1* | 8/2011 | Haspers | ............... | A47B 81/00 454/184 |
| 2011/0291852 A1* | 12/2011 | Forristal | ............... | H05K 7/186 340/686.1 |

(Continued)

OTHER PUBLICATIONS

U.S. Appl. No. 15/276,704, filed Sep. 26, 2016, Brock Robert Gardner, et al.

(Continued)

*Primary Examiner* — David M Sinclair
*Assistant Examiner* — Robert D Brown
(74) *Attorney, Agent, or Firm* — Robert C. Kowert; Meyertons, Hood, Kivlin, Kowert & Goetzel, P.C.

(57) ABSTRACT

A wall structure includes mounting brackets for server components to be mounted to the wall structure. Different server components are coupled together via one or more data communication coupling devices, such as cables, to form a functional server. The data communication coupling devices and the server components are configured to allow the server components to be coupled and decoupled from one another to form functional servers having various configurations. In some embodiments, the server components and data communication coupling devices are accessible via an aisle adjacent to the wall structure and the server components are hot-swappable so that server components can be added to or removed from a functional server while other server components included in the functional server remain in operation.

20 Claims, 13 Drawing Sheets

(56) References Cited

U.S. PATENT DOCUMENTS

| | | | |
|---|---|---|---|
| 2014/0120824 A1* | 5/2014 | Lin ...................... | H05K 7/1497 |
| | | | 454/184 |
| 2015/0047268 A1* | 2/2015 | Pensi ................... | A47B 96/027 |
| | | | 52/36.1 |
| 2015/0077924 A1* | 3/2015 | Rauline ................ | H05K 7/1489 |
| | | | 361/679.39 |
| 2015/0208554 A1* | 7/2015 | Leigh ........................ | G06F 1/20 |
| | | | 165/80.3 |
| 2015/0327381 A1* | 11/2015 | Alshinnawi .......... | H05K 7/1492 |
| | | | 361/679.02 |
| 2016/0103472 A1* | 4/2016 | Schuette ................ | G06F 1/189 |
| | | | 361/679.33 |
| 2016/0194863 A1* | 7/2016 | Schmitt ............... | E04B 1/34321 |
| | | | 52/79.1 |
| 2016/0194893 A1* | 7/2016 | Schmitt ................... | H02K 7/18 |
| | | | 52/173.1 |
| 2016/0291645 A1* | 10/2016 | Alvarado ................ | G06F 1/183 |
| 2017/0303439 A1* | 10/2017 | Cader ................ | H05K 7/20736 |

OTHER PUBLICATIONS

U.S. Appl. No. 13/792,962, filed Nov. 24, 2015, John William Eichelberg, et al.
U.S. Appl. No. 14/949,589, filed Nov. 23, 2015, John William Eichelberg, et al.
U.S. Appl. No. 14/311,178, filed Jun. 20, 2014, Matthew Thomas Phillips, et al.

* cited by examiner

CONFIGURABLE SERVER COMPONENTS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computing devices with multiple processors may generate 250 watts of waste heat. Some known computing systems include a plurality of such larger, multiple-processor computing devices that are configured into rack-mounted components, and then are subsequently positioned within a server rack. Some known server racks include 40 such rack-mounted components and such server rack systems will therefore generate as much as 10 kilowatts of waste heat. Moreover, some known data centers include a plurality of such server rack systems.

Some known data centers include methods and apparatus that facilitate waste heat removal from server rack systems. In some data centers, server airflow leakage significantly reduces efficiency of cooling systems. According to some studies, for example, servers can leak cold air into the hot air stream at a rate of 23%-135% of their designed flow rate. Some containment systems will leak air and cause mixing due to height variations between racks at the top of containment systems and will leak air when exposed to differential static pressures over the area of the containment systems.

Also, the amount of computing capacity needed for any given data center may change rapidly as business needs change. Initially providing computing capacity in a data center, re-configuring an existing capacity of a data center, or expanding an existing capacity of a data center (in the form of additional servers, for example), as well as cooling air for such additional capacity, is resource-intensive and may take many months to effect. Moreover, traditional arrangements of servers mounted in server racks may be complicated to reconfigure to meet changing business needs. For example, increasing a compute or storage capacity of a traditional server may require physically removing the server and re-engineering the server to include more compute or storage capacity. Often costs of re-engineering traditional servers may exceed costs of replacing the traditional servers with new servers having the desired capacities. Also, in traditional servers a group of multiple computing devices mounted in a common chassis may be rendered inoperative due to a failure of an individual one of the group of computing devices mounted in the common chassis despite other ones of the group of computing devices mounted in the common chassis not being failed. Thus a failure of a single component may render a group of non-failed computing devices mounted in a common chassis inoperative and reduce overall computing capacity of a facility.

Figure 1:
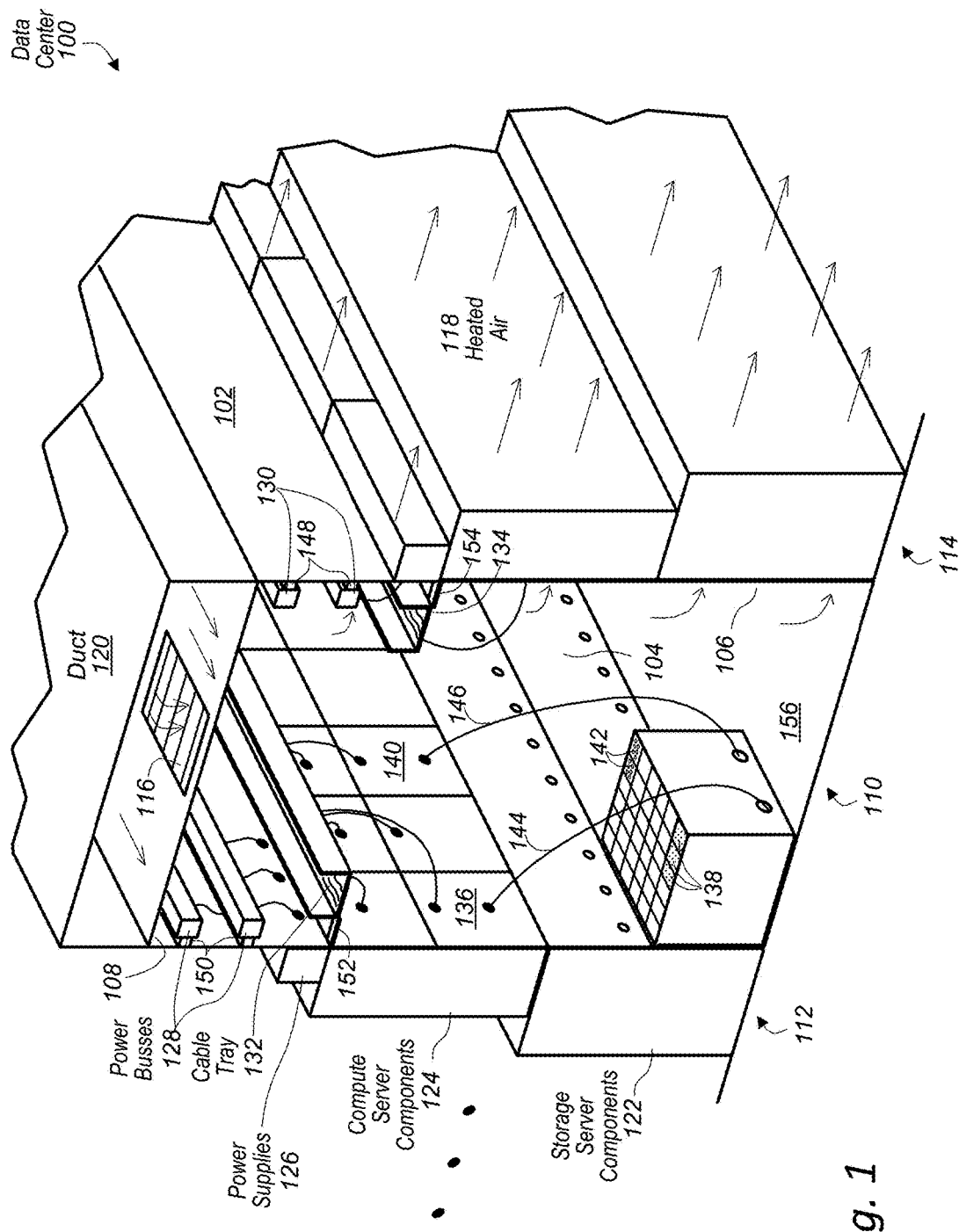
FIG. 1 illustrates a perspective view of a portion of a data center comprising an air containment structure with computing devices mounted to walls of the air containment structure, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of mounting structures, and systems and methods of installing and utilizing mounting structures are disclosed. According to one embodiment, a data center includes a first row of computing devices, a second row of computing devices, an aisle between the first row and the second row of computing devices and an air containment structure. The air containment structure is configured to separate air in the aisle from other air in the data center. Furthermore, the air containment structure comprises a first wall comprising mounting brackets that mount the computing devices of the first row to the first wall of the air containment structure. The air containment structure also comprises a second wall comprising mounting brackets that mount the computing devices of the second row to the second wall of the air containment structure. Furthermore, the air containment structure comprises a ceiling spanning a space between the first wall and the second wall of the air containment structure. The first wall and the second wall of the of the air containment structure are configured to support respective weights of the computing devices of the first row of computing devices and to support respective weights of the computing devices of the second row of computing devices. In some embodiments, an air containment structure may be a contiguous structure that spans a length of an aisle, wherein multiple sets of computing devices are mounted to the air containment structure along the length of the aisle. Also, in some embodiments, an air containment structure may be used to mount and support computing devices in a data center instead of server racks which are commonly used to mount and support servers in a data center. Furthermore, in some embodiments, server components may mount directly to an air containment structure as individual components. This is in contrast to traditional servers wherein server components are mounted in a common server chassis that is then mounted in a server rack. Thus, in some embodiments, an air containment structure may eliminate the need for server components to be mounted in server chassis and for server chassis to be mounted in server racks as commonly done in data centers. Furthermore, in some embodiments, infrastructure systems for computing devices may be mounted to an air containment structure and may be supported by the air containment structure. For example, power bus bars that distribute electrical power to computing devices mounted to an air containment structure may be mounted directly to the air containment structure. In addition, cable trays for network cabling and an air plenum for a cooling system may also be mounted to an air containment structure. In some embodiments, infrastructure systems may be mounted to an air containment structure prior to the air containment structure being delivered to an installation location. In such embodiments, installation of air containment structures in a data center may be more efficient than traditional server rack arrangements because infrastructure systems are pre-installed in the air containment structure. In some embodiments, air containment structures may be delivered to an installation location with computing devices pre-installed in the air containment structure along with infrastructure systems for the computing devices pre-installed on the air containment structure.

According to one embodiment, an apparatus comprises an air containment structure configured to separate air in a space encompassed by the air containment structure from other air in a computing facility. The air containment structure includes a first wall comprising mounting brackets configured to mount computing devices to the first wall and support the computing devices mounted to the first wall; a second wall comprising mounting brackets configured to mount computing devices to the second wall and support the computing devices mounted to the second wall; and an aisle between the first wall and the second wall.

According to one embodiment, a method includes providing an air containment structure comprising an aisle between walls of the air containment structure and mounting computing devices to one of the walls of the air containment structure via mounting brackets of the wall, wherein the wall and the mounting brackets are configured to support respective weights of the computing devices.

According to one embodiment, a data center includes a wall structure extending along an aisle of the data center. For example, a wall structure may be a structure in an interior of a data center that extends vertically in the data center from the floor of the data center, such as a wall of an air containment structure. In some embodiments, a wall structure may extend to a height less than a height of a ceiling of the data center or may extend to a height of the ceiling of the data center. The wall structure includes mounting brackets configured to mount computing devices to the wall structure. The data center also includes computing devices mounted to the wall structure via the mounting brackets, wherein the computing devices include a group of compute server components mounted to the wall structure and a group of storage server components mounted to the wall structure. The data center also includes data communication coupling devices configured to couple together respective ones of the compute server components and respective ones of the storage server components as respective sets of coupled server components, wherein each set of the respective sets of coupled server components is configured such that the coupled server components of the respective set operate together as a respective functional server. The data communication coupling devices and the server components are configured to permit the server components to be coupled together and decoupled from one another to form different configurations of the respective sets of coupled server components that operate together as respective functional servers. For example, in some embodiments the data communication devices may be cables and the server components may be configured to be coupled together via the cables, and re-coupled together via the cables into different functional server configurations including different server components.

According to one embodiment, an apparatus includes a wall structure comprising a first set of mounting brackets configured to mount a first group of server components to the wall structure and a second set of mounting brackets configured to mount a second group of server components to the wall structure, wherein the first group of server components and the second group of server components comprise different types of server components. The apparatus further includes communication coupling devices configured to couple together respective server components of the first group of server components with respective server components of the second group of server components such that respective sets of the coupled server components operate together as respective functional servers. In some embodiments, the data communication devices may be cables and the server components may be configured to be coupled together via the cables, and may be configured to be re-coupled together via the cables to form functional server configurations including different server components.

According to one embodiment, a method includes mounting server components of a first group of server components to a wall structure via a first set of mounting brackets of the wall structure and mounting server components of a second group of server components to the wall structure via a second set of mounting brackets of the wall structure, wherein the first group of server components and the second group of server components include different types of server components. The method further includes coupling together one of the server components of the first group of server components and one of the server components of the second group of server components to form a coupled set of server components that operate together as a functional server.

As used herein, an "air handling system" means a system that provides or moves air to, or removes air from, one or more systems or components.

As used herein, an "aisle" means a space next to one or more rows of computing devices.

As used herein, a "cable" includes any cable, conduit, or line that carries one or more conductors and that is flexible over at least a portion of its length. A cable may include a connector portion, such as a plug, at one or more of its ends.

As used herein, a "cold aisle" means an aisle from which air can be drawn for use in removing heat from a system, such as computing devices.

As used herein, "computing" includes any operations that can be performed by a computer, such as computation, data storage, data retrieval, or communications.

As used herein, "computing device" includes any of various devices in which computing operations can be carried out, such as computer systems or components thereof, for example compute server components and storage server components. As used herein, the term computing device is not limited to just those integrated circuits referred to in the art as a computer, but broadly refers to a processor, a server component, a microcontroller, a microcomputer, a programmable logic controller (PLC), an application specific integrated circuit, and other programmable circuits, and these terms are used interchangeably herein. Some examples of computing devices include compute server components, storage server components, network devices, and telecommunications equipment. Storage server components may include one or more memory devices. In various embodiments, memory devices may include, but are not limited to including, a computer-readable medium, such as a random access memory (RAM). Alternatively, a compact disc-read only memory (CD-ROM), a magneto-optical disk (MOD), and/or a digital versatile disc (DVD) may also be used in a memory device. In some embodiments, a memory device may include, a hard disk drive, a non-volatile memory device such as a flash memory, and the like.

As used herein, "data center" includes any facility or portion of a facility in which computer operations are carried out. A data center may include servers and server components coupled together as functional servers, wherein the servers and functional servers are dedicated to specific functions or serve multiple functions. Examples of computer operations include information processing, communications, testing, simulations, power distribution and control, and operational control.

As used herein, a "duct" includes any tube, pipe, conduit, or combination thereof, that has one or more passageways through which a fluid can be conveyed. Examples of materials for a duct include cloth, fabric, extruded metal, sheet metal, a polymer, or a combination thereof. A passageway of a duct may have any size and shape. The cross section of a duct may be square, round, ovate, rectangular, or irregular, a passageway of a duct may have a constant or changing cross section or a cross section that changes over the length of the passageway.

As used herein, a "hot aisle" means an aisle into which heated air can be discharged for use in removing heat from a system, such as a server components.

As used herein, "infrastructure" means systems, components, or elements of a system that provide resources for a computing device, such as electrical power, data exchange capability with external systems, air, heat removal, and environmental control (for example, humidity control, particulate control).

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. In some embodiments, mounting the particular element to another element includes coupling the elements such that the other element provides one or more of structural support, positioning, structural load transfer, stabilization, shock absorption, some combination thereof, or the like with regard to the particular element.

As used herein, a "rack" means a rack that contains or physically supports one or more server chassis. For example, a rack may be an electronic industries alliance (EIA) standard rack or may be a rack that varies from an EIA standard but functions in a similar manner as a standard rack.

As used herein, a "row" means a number of objects arranged in a line. A row may include objects arranged in a straight line or may include objects arranged in a curved line. For example, a row of computing devices may comprise multiple computing devices arranged in a line.

As used herein, a "server component" refers to a computing device that when coupled with other server components functions along with the other server components as a functional server. For example, a server component may be a circuit board comprising processors mounted on the circuit board. Also, a server component may be a data storage device, such as a hard disk drive, a solid state drive, a non-volatile memory device, or the like. In some embodiments, a server component may be other types of computing device that are used in servers. In some embodiments multiple server components individually mounted to a wall structure may be coupled together to form a functional server.

As used herein, a "space" means a space, area or volume.

Some data centers include servers mounted in server racks. The server racks may be lined up in rows of server racks within the data center. In such arrangements, air from a cold air source, such as a cold aisle, may flow between server racks, above server racks, or below server racks and mix with air that has been heated by removing waste heat from heat producing components in the servers. These air leaks of cold air in between above or below server racks may reduce an efficiency of cooling systems that cool computing devices mounted in the server racks. These air leaks may also cause computing devices mounted in server racks to receive inadequate cooling. In some instances hot air may mix with cold air in a cold aisle prior to the cold air being drawn into the servers thus pre-heating the cold air. In order to reduce cold air leaks and mixing of cold air with heated air prior to the cold air being drawn into a rack mounted server, various barriers may be implemented to reduce leaks and mixing of cold air and heated air. However, spaces between adjacent server racks and gaps between a top of a server rack and a ceiling may be difficult to seal off with such barriers. Also, continuous vigilance may be required on the part of data center operators to ensure the barriers are in place and remain in place after maintenance operations are performed. Furthermore, installation of such systems may be time consuming and costly. For example, each server rack may be separately installed in a data center, subsequent to installation of server racks, servers may be installed in the server racks. Additionally air barriers may be installed between, above, and/or below the server racks to reduce air leaks and cold and hot air mixing.

In order to reduce air leaks, cold air and hot air mixing, and in order to reduce costs and complexity of installing computing devices in a data center, in some embodiments, an air containment structure may be used in the data center. The air containment structure may segregate cold air in a cold aisle from other air in a data center. Furthermore the air containment structure may include brackets for mounting computing devices such as server components to the air containment structure without using server racks and/or without using a server chassis to support the server components. For example, in contrast to current data centers that mount servers in server racks, server components may be mounted to walls of an air containment structure without server racks supporting the server components. Thus, spaces (e.g. leak paths) between adjacent server racks and between a server rack and ceiling of a cold aisle or between a server rack and a floor of a cold aisle may be reduced or eliminated.

In some embodiments, an air containment structure may span a length of an aisle or a portion of a length of an aisle and may include multiple computing devices mounted to the air containment structure along the length of the aisle. Furthermore, in some embodiments, infrastructure systems, such as power bus bars, network cable trays, and air ducts may be mounted to or included in an air containment structure. In some embodiments, infrastructure systems and/or computing devices may be pre-installed in an air containment structure prior to the air containment structure being delivered to an installation location, such as a data center. Installation of computing devices mounted to air containment structures may require less time and less cost than installation of computing devices in traditional server racks. For example, an air containment structure may include an equivalent quantity of computing devices mounted to the air containment structure as are included in multiple server racks on either side of a cold aisle. Thus installing a single air containment structure may provide an equivalent amount of computing capacity as installing multiple server racks filled with servers on either side of a cold aisle with fewer installation tasks to be performed. Furthermore, additional tasks of installing and maintaining barriers to reduce leaks and mixing of cold air with hot air may be eliminated when an air containment structure is used in place of traditional server racks.

Furthermore, in some embodiments, a wall structure, such as a wall of an air containment structure or a stand-alone wall structure separate from an air containment structure may include multiple mounting brackets configured to mount different types of server components to the wall structure. For example, server components may include compute server components, such as circuit boards including one or more processors, storage server components, such as mass storage devices, or networking devices, such as switches and routers. As opposed to traditional servers that include a fixed number of server components coupled together and mounted in a server chassis, server components mounted to a wall structure may be coupled together via one or more data communication coupling devices, such as cables, in customized configurations based on current computing needs of the data center. The data communication coupling devices may couple together various quantities and types of server components mounted to the wall structure to form various functional servers having different capacities. The capacities of a functional server may depend on the quantity and types of server components that are coupled together to form the functional server. As demand for different types of server configurations changes, server components coupled together to form a functional server may be re-configured into different configurations by coupling additional server components or by de-coupling currently coupled server components from a set of server components that operate together as a functional server. Thus server components mounted to a wall structure and coupled together as functional servers may allow server configurations to be changed to match a current demand at a data center without requiring the server components to be unmounted from the wall structure.

Also, in some embodiments server components of a functional server may be hot-swappable components such that a server component may be decoupled from other server components that make up a functional server while the other server components continue to operate as the functional server. In some circumstances, a server component being de-coupled from other server components that make up a functional server may be a failed server component or may be a server component that is to be included in a different functional server to change a capacity of the additional functional server. Also, hot-swappable server components that operate together as a functional server may be configured to accept an additional server component to be coupled together with the hot-swappable server components that make up the functional server to increase a capacity of the functional server. Thus server components mounted to a wall structure and coupled together via data communication coupling devices may be mixed and matched into sets of coupled server components that operate together as functional servers based on changing capacity needs for the functional servers.

FIG. 1 illustrates a perspective view of a portion of a data center comprising an air containment structure with computing devices mounted to walls of the air containment structure, according to some embodiments.

Data center 100 includes air containment structure 102. A single air containment structure 102 is illustrated in FIG. 1, however, in some embodiments a data center, such as data center 100, may include multiple air containment structures 102 arranged in aisles in the data center. An air containment structure, such as air containment structure 102, may include a first wall, a second wall, and a ceiling spanning an aisle between the first and second walls. For example, air containment structure 102 includes wall 104, wall 106, and ceiling 108 spanning aisle 110. Aisle 110 runs between wall 104 and wall 106 on an interior side 156 of air containment structure 102. In some embodiments, an air containment structure may be a contiguous structure including walls and a ceiling, such as wall 104, wall 106, and ceiling 108. In some embodiments a ceiling of an air containment structure may include a portion of an air plenum, such as duct 120. A portion of an air plenum may be a bottom surface of the air plenum that functions as part of the air plenum and also functions as a portion of a ceiling of an aisle. For example, a bottom surface of duct 120 makes up at least a portion of ceiling 108.

An aisle of an air containment structure, such as aisle 110, may be configured for data center personnel to walk in the aisle. Also, an aisle of an air containment structure, such as aisle 110, may be a cold aisle that receives cold air from an air handling system via an air plenum included in a ceiling of the air containment structure. For example, aisle 110 may receive cold air from an air handling system via vent 116 of duct 120. Also, an air containment structure may separate air in the aisle of the air containment structure, for example cold air in aisle 110, from other air in the data center. For example, a space in data center 100 not enclosed by air containment structure 102 may be a hot aisle, such as hot aisle 118, and an air containment structure, such as air containment structure 102, may separate cold air in the air containment structure from hot air in the hot aisle of the data center, such as hot aisle 118.

Computing devices may be mounted to walls of an air containment structure and may be supported by the air containment structure. An air containment structure may provide structural support for computing devices mounted to the air containment structure without using server racks as commonly used in other data centers to support the computing devices. Furthermore, in some embodiments, computing devices may be server components that mount to a wall structure of an air containment structure without being mounted in a common server chassis.

In some embodiments, server components may be mounted to a stand-alone wall structure that is separate from an air containment structure. For example, server components mounted to a wall structure may be mounted to a wall structure of an air containment structure as illustrated in FIG. 1 or, in some embodiment, may be mounted to a wall structure that is not included in an air containment structure. For example, in some embodiments, ceiling 108 may be omitted.

Computing devices mounted to a wall structure may make up a row of computing devices in a data center. For example, row of computing devices 112 are mounted to wall 104 and row of computing devices 114 are mounted to wall 106.

In some embodiments, a row of computing devices may comprise servers mounted in a traditional server chassis, where the server chassis are mounted to a wall structure of an air containment structure and are supported by the air containment structure (e.g. the servers may be supported without server racks). In other embodiments, server components may be mounted to a wall structure, such as wall 104 or wall 106, to form a row of computing devices without being mounted in a common server chassis such as is done in traditional server arrangements.

Server components may include various types of computing devices. For example, in some embodiments, server components may include compute server components comprising computing devices configured to primarily perform compute operations. Server components may also include storage server components comprising computing devices configured to primarily perform storage operations. For example, a compute server component may include a printed circuit board including one or more processors configured to primarily perform compute operations. Also, a storage server component may include a hard disk drive, a non-volatile memory device, such as a flash memory device, or other suitable type of memory device primarily configured to perform storage operations.

In some embodiments, server components of a row of server components may be grouped into groups of similar types of server components and the groups of server components may be vertically arranged on a wall structure based on an amount of waste heat generated by the different types of server components. For example, server components of a type of server component that generates more waste heat than other types of server components may be mounted on a wall structure at a higher elevation than the other types of server components that generate less waste heat. Such an arrangement may improve cooling efficiency of server components as compared to other arrangements because as air is heated by the server components a portion of the air may rise in the air containment structure. Because server components are arranged vertically based on an amount of waste heat generated by the server components, air may pass over cooler server components before passing across hotter server components. This may prevent pre-heated air from a hotter server component passing across a cooler server component. For example, storage server components 122 are mounted in a lower zone of wall 104, compute server components 124 are mounted above storage server components 122 in a mid-zone of wall 104 and power supplies 126 are mounted in an upper zone of wall 104.

In some embodiments, infrastructure systems may also be mounted to a wall structure, such as a wall 104 or a wall 106 of air containment structure 102. In some embodiments, infrastructure systems may include power bus bars, such as power bus bars 128 and 130, that distribute electrical power to power supplies and/or computing devices mounted to a wall structure and cable trays, such as cable trays 132 and 134, that support network cables that are routed to computing devices mounted to a wall structure. In some embodiments, computing devices mounted to a wall structure may include one or more network devices such as switches and/or routers. For example one of compute server components 124 may be a network device and cable tray 132 or cable tray 134 may support network cables routed to the network device.

In addition to or instead of being arranged based on waste heat generation, groups of server components mounted to a wall structure may be arranged based on a frequency at which the server components are physically accessed. For example, server components that fail more often may be arranged in lower positions than server components that fail less frequently.

Different types of server components may be coupled together via one or more data communication coupling devices, such as cables, to form a set of coupled server components. A set of coupled server components may operate together as a functional server. For example, in FIG. 1 compute server component 136 is coupled with storage server components 138 via cable 144 and compute server component 140 is coupled with storage server components 142 via cable 146. Coupled compute server component 136 and storage server components 138 may operate together as a functional server wherein processing operations are primarily performed by compute server component 136 and data storage is performed by storage server components 138.

In some embodiments, data communication coupling devices, such as cables 144 and 146, and server components, such as compute server components 124 and storage server components 122 may be configured to be coupled together and decoupled from one another to form various functional server configurations having various ratios of compute server components to storage server components. For example, if additional computing capacity is needed for a given functional server, an additional compute server component may be coupled with coupled server components that operate together as the functional server. Adding the additional compute server component may reconfigure the functional server to have more compute capacity. In some embodiments, server components may be hot pluggable such that server components can be added to or removed from a coupled set of storage server components that operate together as a functional server while other ones of the coupled server components of the functional server remain in operation. In some embodiments, hot-pluggable data communication coupling devices, such as cables 144 and 146 may be routed in front of server components, such as illustrated in FIG. 1. In some embodiments, hot-pluggable data communication devices, such as cables 144 and 146 may be routed in a wall structure of an air containment structure or may be routed through a hot aisle, such as hot aisle 118. For example, in some embodiments, cables may be routed within a wall structure of an air containment structure or behind a wall structure of an air containment structure such that the ends of the cable are accessible from a front side of a wall structure or from a cold aisle, such as aisle 156, while a portion of a span of the cables runs behind server components mounted in the wall structure.

In some embodiments, network cabling may be routed directly from cable trays, such as cable trays 132 and 134 to a line card included in server components, such as compute server components 124.

In some embodiments, an air containment structure, such as air containment structure 102, may be fabricated as a single unit prior to being delivered to an installation location. Furthermore, in some embodiments infrastructure systems, such as power bus bars 128 and 130, cable trays 132 and 134, and duct 120 may be included in an air containment structure prior to the air containment structure being delivered to an installation location. For example as part of an assembly process of air containment structure 102, power bus bars 128 and 130 may be mounted to air containment structure 102 via mounting brackets 148 and 150. Also, as part of an assembly process of air containment structure 102, cable trays 132 and 134 may be mounted to air containment structure 102 via mounting brackets 152 and 154. Furthermore, duct 120 may make up ceiling 108 of air containment structure 102 and may be included with air containment structure 102 when air containment structure 102 is delivered to an installation location. Because an air containment structure, such as air containment structure 102, may be delivered to an installation location with infrastructure systems already mounted in or included in the air containment structure, installation of air containment structures in a data center may involve fewer steps and less time than installation of traditional server racks and support infrastructure for the server racks.

Also, in some embodiments, in addition to infrastructure support systems being included in an air containment structure prior to the air containment structure being delivered at an installation location, computing devices may also be pre-installed in an air containment structure prior to the air containment structure being delivered an installation location. Thus, additional steps of installing computing devices, such as server components, at an installation location may be eliminated or reduced further simplifying installation of computing devices mounted to air containment structures in a data center. In embodiments wherein server components mount to a wall structure that is separate from an air containment structure, the server components may also be pre-installed on the wall structure prior to the wall structure being delivered at an installation location. While not illustrated in FIG. 1, in some embodiments computing devices that are servers including server components mounted in a common chassis may be mounted to an air containment structure in a similar manner as the server components illustrated in FIG. 1 and may be pre-installed in the air containment structure prior to the air containment structure being delivered to an installation location.

Figure 2:
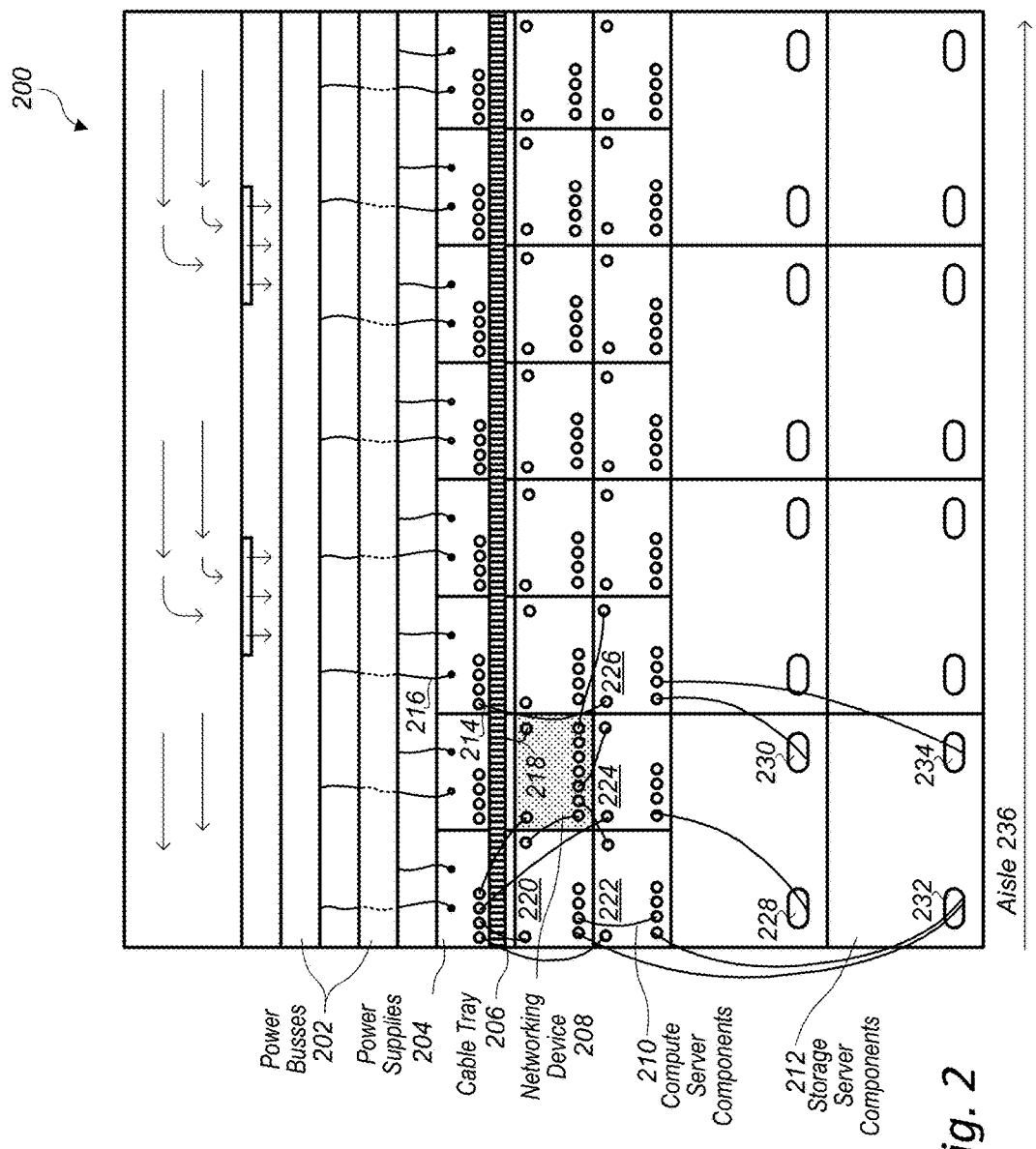
FIG. 2 illustrates a front view of a wall of an air containment structure with computing devices mounted to the wall of the air containment, according to some embodiments.

FIG. 2 illustrates a front view of a wall of an air containment structure with computing devices mounted to the wall of the air containment, according to some embodiments. Wall structure 200 may be one of walls 104 or 106 illustrated in FIG. 1 or may be a stand-alone wall structure. Wall structure 200 includes power busses 202, power supplies 204, cable trays 206, networking device 208, compute server components 210, and storage server components 212 all mounted to wall structure 200 and physically supported by wall structure 200. Power busses 202 may provide redundant power sources for respective ones of power supplies 204. A power supply 204 may be coupled to compute server components, storage server components, and/or network devices via power cables 214. Power may be supplied to power supplies 204 via power cables 216 that connect power supplies 204 to a tap box or other suitable connection to power busses 202. In the embodiment illustrated in FIG. 2 power cables 214 are routed from power supplies 204 to server components 208, 210, and 212 via cables interfacing with front sides of server components 208, 210, and 212. In some embodiments, power cables, such as power cables 214, may be routed in a wall structure to a back-side of server components, such as server components 208, 210, or 212.

A networking device, such as networking device 208, may be included in a space in a wall structure at various locations along the wall structure along with other server components. In some embodiments, a networking cable, such as cable 218, may be routed from a cable tray, such as cable tray 206, to a networking device, such as networking device 208. In turn, the networking device may be coupled with multiple ones of the other server components mounted to the wall structure to provide network connectivity to the other server components. For example, compute server components 220 and 222 along with storage server components 228 and 230 are coupled together as a functional server that is coupled to networking device 208 via a cable coupling compute server component 222 with networking device 208. In some embodiments, multiple network devices, such as networking device 208, may be included in spaces in a wall structure. For example, in some embodiments a networking device, such as a networking device, may connect to other lower-level networking devices that are also included in a wall structure and cables between the networking devices may be routed through a cable tray of a wall structure, such as cable tray 206.

Compute server components and storage server components may be coupled together in various ratios to configure functional servers with various amounts of compute and storage capacities based on demand for different types of functional servers at the data center. For example, a single compute server component 224 is coupled with storage server component 228 to form a functional server. Whereas compute server 226 is coupled with two storage server components (storage server components 230 and 234) to form a functional server with more storage capacity. Also, compute server components 220 and 222 are coupled together along with storage server components 228 and 232 to form a functional server with more compute capacity and more storage capacity than the functional server comprising compute server component 224 and storage server component 228. Thus multiple functional servers having various capacities may be configured by coupling together different ratios of different types of server components each having different capacities.

As illustrated in FIG. 2, server components and infrastructure systems may be mounted to a wall structure that spans a length or a partial length of an aisle, such as aisle 236. In some embodiments, a wall structure or an air containment structure may span a length that corresponds to a length of a power bus bar. For example, in some embodiments a wall structure of an air containment structure may span a length of 15-20 feet. In some embodiments a wall structure or an air containment structure may span other lengths.

Figure 3:
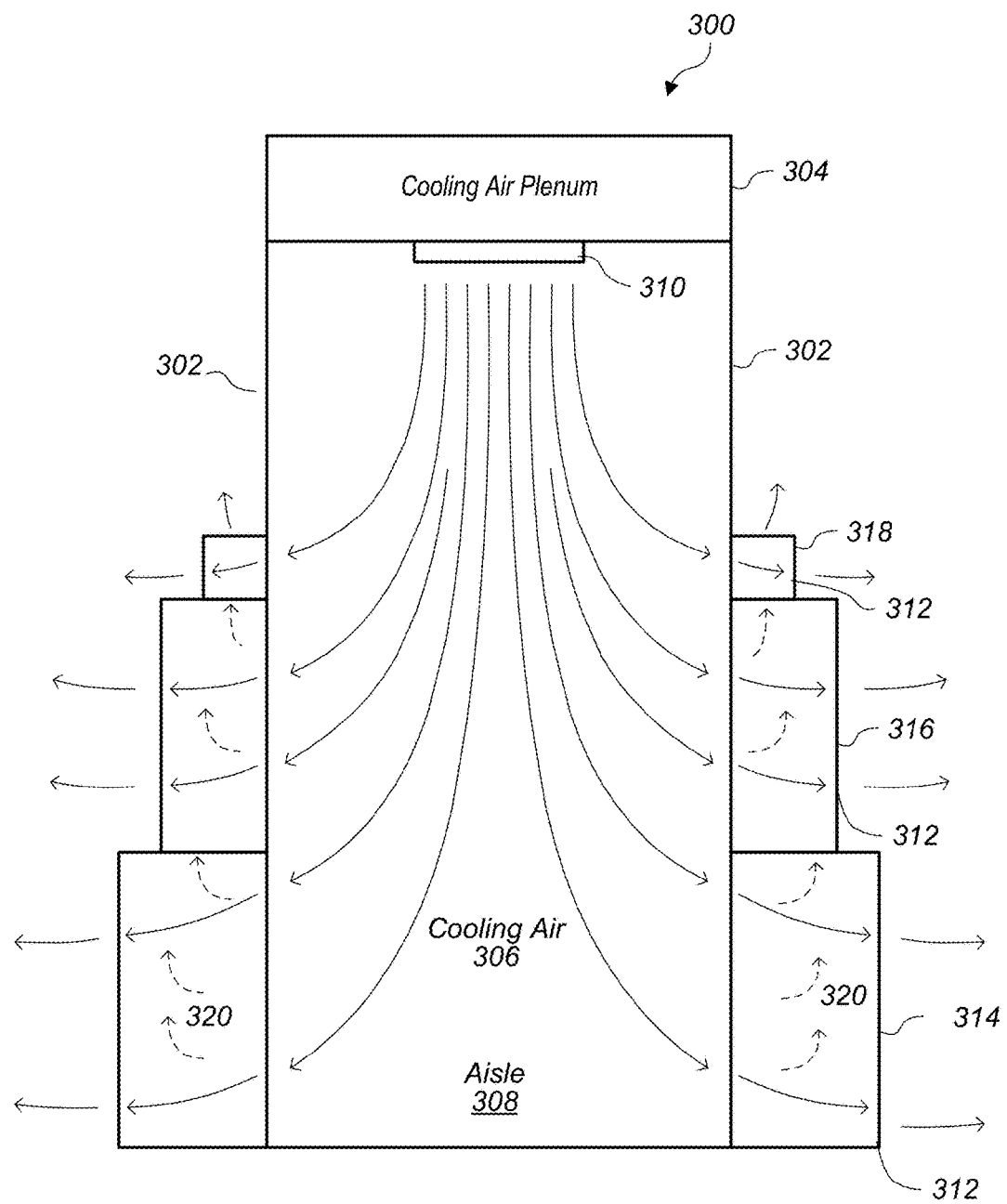
FIG. 3 illustrates an end view of an air containment structure showing air flow through computing devices mounted to the air containment structure, according to some embodiments.

FIG. 3 illustrates an end view of an air containment structure showing air flow through computing devices mounted to the air containment structure, according to some embodiments. Air containment structure 300 illustrated in FIG. 3 may be the same as air containment structure 102 illustrated in FIG. 1. Walls 302 of air containment structure 300 may be the same as wall structure 200 illustrated in FIG. 2.

In some embodiments, air may be directed into an aisle of an air containment structure from a duct that makes up a portion of a ceiling of an air containment structure. The air may be drawn into server components or servers mounted to the air containment structure from the aisle. For example, cooling air 306 is directed from air plenum 304 into aisle 308 via vents 310. The cooling air may be drawn through server components or servers mounted to a wall structure, such as wall structure 302, and may be exhausted out of the air containment structure via a perforated partition. For example, air containment structure 300 may include perforated walls 312 that run along a back side of server components such as storage server components 314, compute server components 316, and power supplies 318. Cooling air 306 may be drawn into server components 314, 316, and 318 via a front side of the server components and may be exhausted into a hot aisle via perforated walls 312. In some embodiments, a perforated wall may be a wall that includes a plurality of openings configured to allow air to pass through the perforated wall. In some embodiments, a perforated wall may be a screen or other suitable barrier that allows air to flow through the barrier.

As illustrated in FIG. 3, a portion of the cooling air passing though the server components may be heated by waste heat being removed from the server components and may flow in a partially vertical direction though a wall structure of an air containment structure. For example air 320 flows in a partially vertical direction through server components 314, 316, and 318. In some embodiments, server components, such as server components 314, 316, and 318 may be vertically arranged based on respective amounts of waste heat generated by the server components. Thus, server components that generate more waste heat are mounted to wall structure 302 at higher elevations than server components that generate less waste heat. For example, power supplies 318 are mounted to wall structure 302 at a higher elevation than compute server components 316. Also, compute server components 316 are mounted to wall structure 302 at a higher elevation than storage server components 314. Such an arrangement may prevent preheated air that has removed waste heat from a server component that generates more waste heat from subsequently passing over a server component that generates less waste heat. This may improve an efficiency of cooling server components as compared to other configurations.

Figure 4:
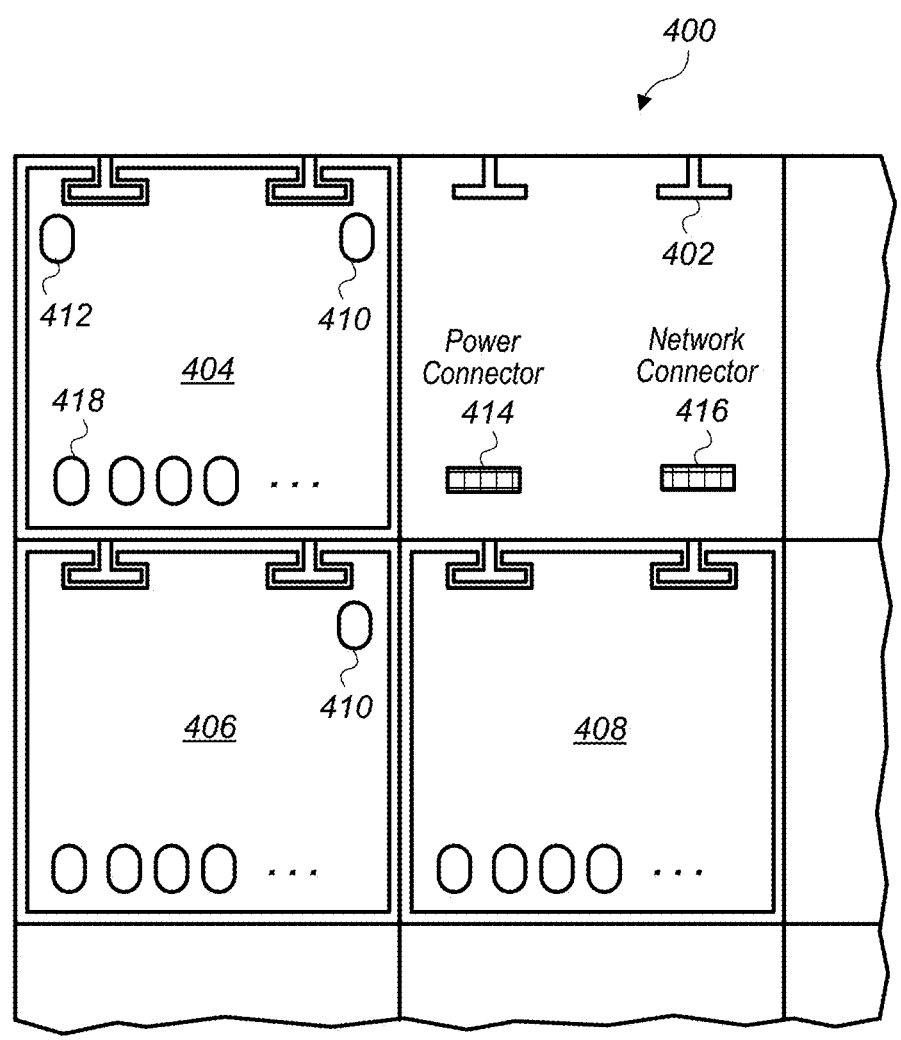
FIG. 4 illustrates computing devices mounted to a wall structure via mounting brackets of the wall structure, according to some embodiments.

FIG. 4 illustrates computing devices mounted to a wall structure via mounting brackets of the wall structure, according to some embodiments. Wall structure 400 may be any of the wall structures or walls of an air containment structure described above in FIGS. 1-3. Wall structure 400 includes mounting brackets 402 configured to mount compute server components, such as compute server components 404, 406, and 408, to wall structure 400. In some embodiments, a mounting bracket may support a server component based on the server component sliding onto a rail of the mounting bracket as shown in FIG. 4. However, in some embodiments various other suitable types of mounting brackets may be used to mount a server component to a wall structure. For example, in some embodiments, brackets, such as brackets 402, may be side rails that are configured for a server component to mount to a pair of side rails on either side of the server component. However, note that as opposed to traditional server racks, mounting brackets of a wall structure, such as wall 400, may support respective weights of the server components without need for additional support such as support provided by a server rack. Also, in some embodiments, mounting brackets of a wall structure may include a tray that is configured to be pulled into and out of a wall structure. In some embodiments, multiple server components may be mounted to a wall structure via a single mounting bracket that comprises a tray. For example in FIG. 1, storage server components 122 are illustrated mounted via a mounting bracket that includes a tray.

In some embodiments, power connections for server components from power supplies may be routed to via power connectors on a front side of the server components as illustrated in FIG. 2. For example, compute storage component 404 includes power connector 410 on a front side of compute server component 404. However, in some embodiments, power connections may be routed from power supplies to server components via a power distribution system that is mounted in a wall structure. For example, wall structure 400 includes power connector 414. Compute server components, such as compute server components 406 and 408, may receive electrical power via a power connection on the backsides of the compute server components that is coupled with respective ones of power connectors of a wall structure, such as power connectors 414 of wall structure 400. Also, in some embodiments, network cabling may be routed from a cable tray directly to server components or may be routed to a networking device and in turn routed from the networking device to server components via networking infrastructure that is built into a wall structure, such as wall structure 400. For example, wall structure 400 includes network connector 416. Compute server components, such as compute server component 408, may be connected to a network via a network connection on the backside of compute server component coupled with a network connector built into a wall structure, such as network connector 416 of wall structure 400. Also, in some embodiments, a server component, such as compute server component 404, may be connected to a network via a network connector on a front side of the server component, such as network connector 412 on a front side of compute server component 404.

In some embodiments, a computing device such as a compute server component, storage server component, or another type of computing device, may include multiple connectors configured to couple with a data communication coupling device, such as a cable, to couple the server component with other server components. For example, four connectors 418 are illustrated for compute server components 404, 406, and 408. In some embodiments, a computing device may include more or less connectors configured to couple with a data communication coupling device, such as a cable, to couple the computing device with other computing devices.

Figure 5:
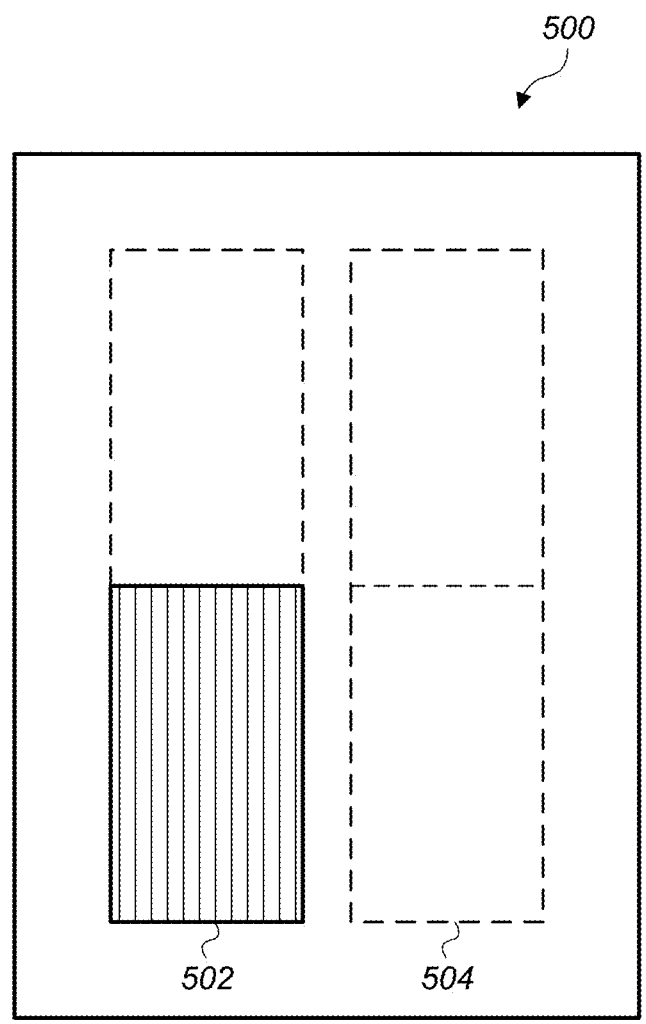
FIG. 5 is a top view of a data center illustrating air containment structures being installed in rows in the data center, according to some embodiments.

FIG. 5 is a top view of a data center illustrating air containment structures being installed in rows in the data center, according to some embodiments. In some embodiments, multiple air containment structures may be coupled together to form longer aisles and rows of computing devices in a data center. For example data center 500 includes air containment structure 502 and spaces 504 for additional air containment structures 502 to be installed in data center 500. In some embodiments, air containment structures, such as air containment structure 502, may be installed in a data center based on current demand for computing and storage capacity at the data center. As additional capacity is needed at a data center additional air containment structures may be installed. Data center 500 may be the same as data center 100 illustrated in FIG. 1 Also, air containment structure 502 may be the same as any of the air containment structures described in FIGS. 1-4. While, FIG. 5 illustrates rows comprising two air containment structures, in some embodiments, a row/aisle of a data center may include more or less air containment structures. In some embodiments, air containment structures may be coupled together and may include a sealing mechanism such as a foam cushion between adjacent air containment structures to seal air in the air containment structures. Also, in some embodiments, infrastructure systems may include appropriate adapters to couple together infrastructure systems of adjacent air containment structures. For example an adapter may couple together power bus bars or cable trays of adjacently installed air containment structures.

Figure 6:
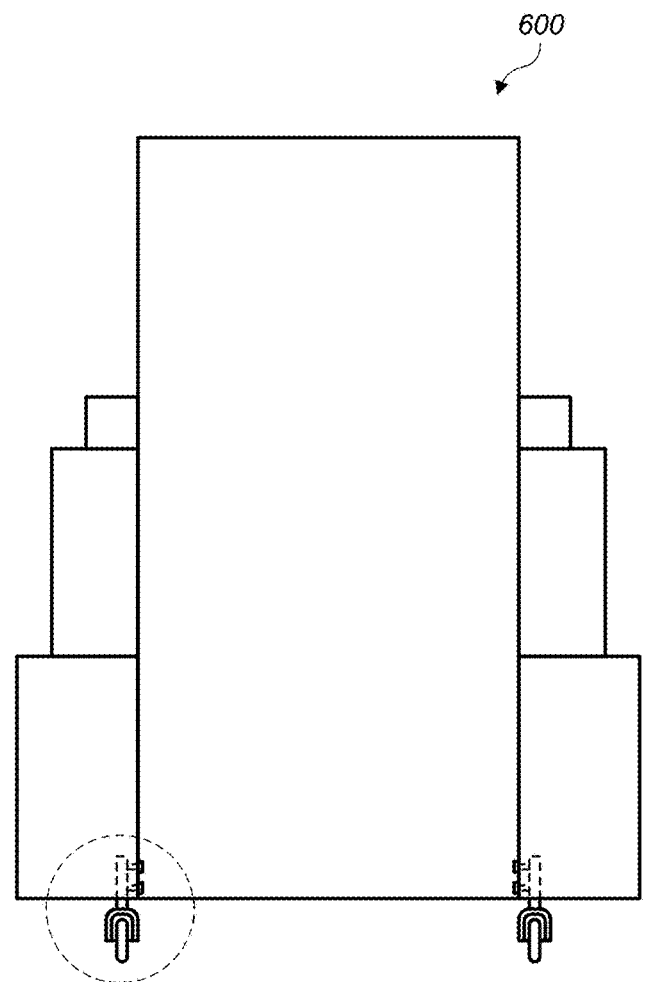
FIG. 6 is an end view of an air containment structure showing removable wheels coupled to the air containment structure, according to some embodiments.
Figure 7:
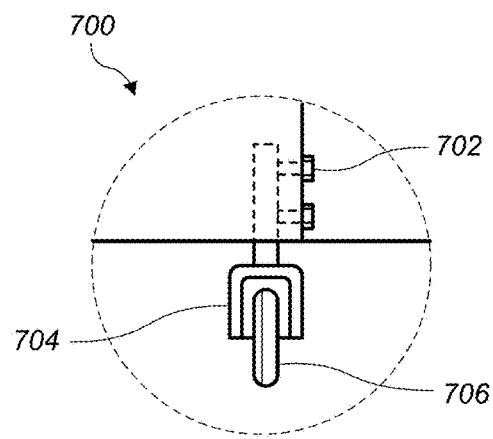
FIG. 7 is an enlarged view of a removable wheel coupled to an air containment structure, according to some embodiments.

FIG. 6 is an end view of an air containment structure showing removable wheels coupled to the air containment structure, according to some embodiments. FIG. 7 is an enlarged view of a removable wheel coupled to an air containment structure, according to some embodiments. In some embodiments, removable wheels may be coupled to an air containment structure in order to move the air containment structure to an installation destination within an installation location, such as a data center. For example, air containment structure 600 includes removable wheel 700 coupled to air containment structure 600. Air containment structure 600 may be any of the air containment structures described in FIGS. 1-5. In some embodiments, various types of removable wheels may be coupled to an air containment structure. In some embodiments, fasteners, such as bolts 702 may be used to secure a wheel housing, such as wheel housing 704, to an air containment structure. In some embodiments, a wheel of a removable wheel, such as wheel 706, may be configured to turn 360 degrees to facilitate movement and positioning of an air containment structure in a data center or other installation location. An air containment structure may be moved through an installation location to an installation destination using removable wheels. In some embodiments, the removable wheels may be removed when the air containment structure is positioned at an installation destination. In some embodiments, wheels, such as wheel 706 may be retractable and may be retracted but not removed from an air containment structure when the air containment structure is positioned at an installation destination.

Figure 8:
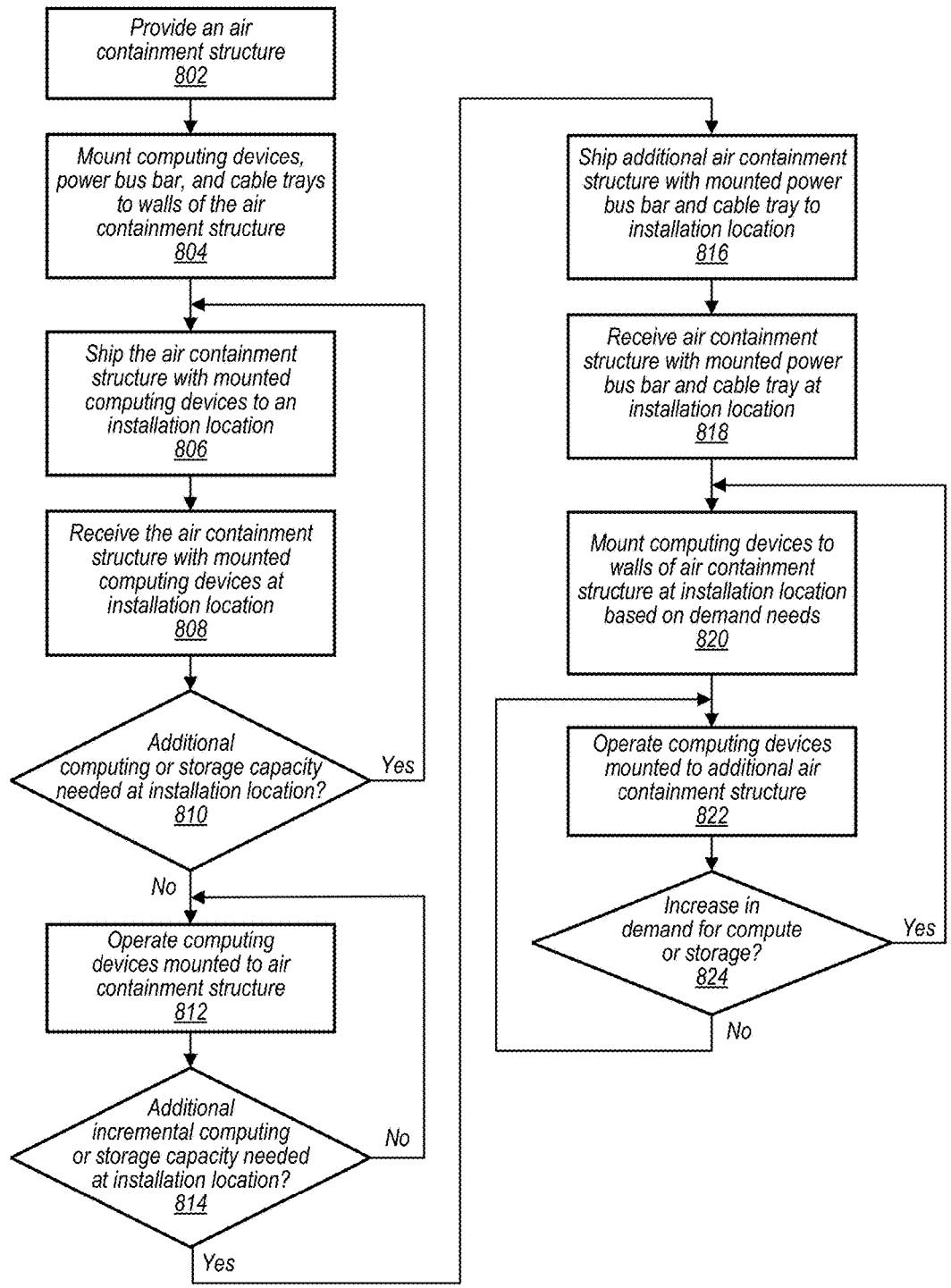
FIG. 8 illustrates installing air containment structures in a data center and operating computing devices installed in the air containment structures, according to some embodiments.

FIG. 8 illustrates installing air containment structures in a data center and operating computing devices installed in the air containment structures, according to some embodiments. At 802 an air containment structure, such as the air containment structures described in FIGS. 1-7 is provided. At 804 computing devices such as servers or server components are mounted to the walls of the air containment structure. Also power bus bars and cable trays are mounted to the walls of the air containment structure. At 806 the air containment structure is shipped to an installation location with computing devices and infrastructure systems already mounted to the air containment structure. In some embodiments, 802 and 804 may be performed by a supplier or fabricator that supplies air containment structures to a customer. In some embodiments, 804 may be performed in part at the installation location instead of prior to shipment of the air containment structure to the installation location.

At 808, the air containment structure is received at an installation location. In some embodiments, one or more removable or retractable wheels as described in FIGS. 6 and 7 may be used to position the air containment structure at an installation destination in the installation location. For example, the one or more removable or retractable wheels may be used to position an air containment structure in a particular row location in a data center. At 808 multiple air containment structures may be shipped to and received at an installation location.

At 810 it is determined if additional computing or storage capacity is needed at the installation location. In response to determining additional capacity is not needed, the computing devices mounted in the air containment structure are put in operation at 812. If it is determined that additional compute and/or storage capacity is needed at the installation location, the process reverts to 806 and additional air containment structures with mounted computing devices are shipped to the installation location.

In some embodiments, only an incremental amount of additional compute or storage capacity may be needed at the installation location. In such circumstances instead of shipping an air containment structure with a full complement of computing devices already installed in the air containment structure, at 816 an air containment structure comprising infrastructure systems but not filled with a full complement of pre-installed computing devices may be shipped to the installation location in response to determining at 814 that incremental computing and/or storage capacity is needed at the installation location. In response to determining that additional incremental computing and/or storage capacity is not needed at the installation location, the process reverts to 812 and the computing devices mounted to the air containment structure are operated.

At 818 the additional air containment structure is received at the installation location and is positioned at an installation destination in the installation location. At 820 an incremental quantity of computing devices such as servers or server components such as compute server components or storage server components are installed in the air containment structure at the installation destination or installation location. At 822 the additional incremental quantity of computing devices are put into operation. At 824 it is determined if there is an incremental increase in demand for compute or storage. If it is determined that there is an incremental increase in demand for compute or storage additional incremental quantities of computing devices are installed at 820. If there is not an incremental increase in demand for compute or storage the process reverts back to 822.

In some embodiments, computing devices mounted to a wall structure may provide other capacities in addition to or instead of compute or storage capacities. In such embodiments, decisions 810 and 824 may be based on these other capacities. For example, computing devices may have a particular capacity for performing specialized processing, such as graphics processing and additional computing devices having graphics processing capacity may be added.

In some embodiments, in addition to or instead of adding additional computing devices as described in FIG. 8, existing computing devices mounted to a wall structure may be reconfigured to meet changing demands for compute and storage. For example, FIGS. 9A and 9B illustrate reconfiguration of server components.

Figure 9B:
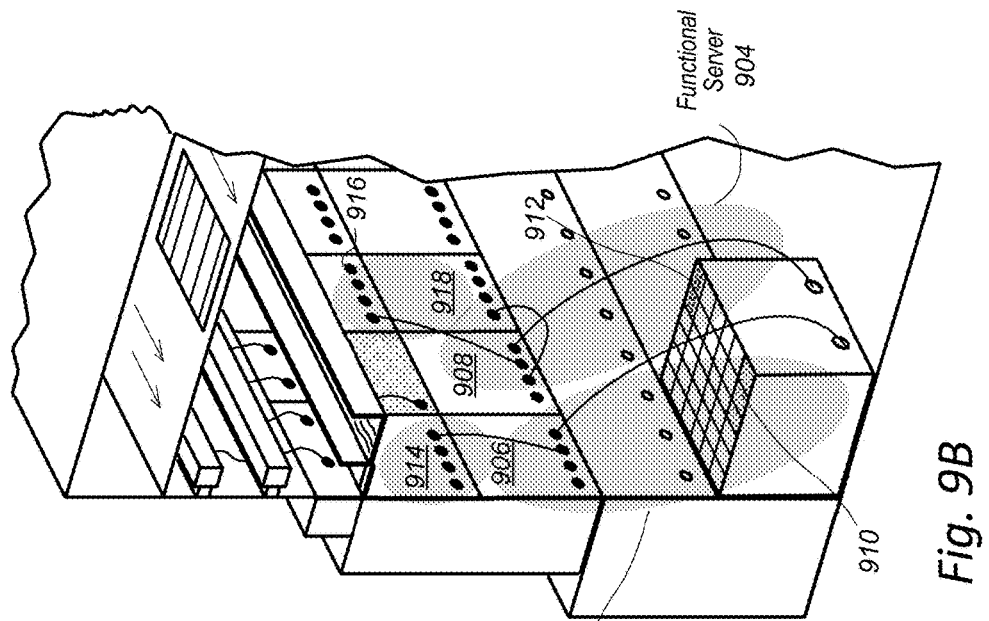
FIG. 9B illustrates server components coupled together in the first configurations being re-configured into a second configuration, according to some embodiments.
Figure 9A:
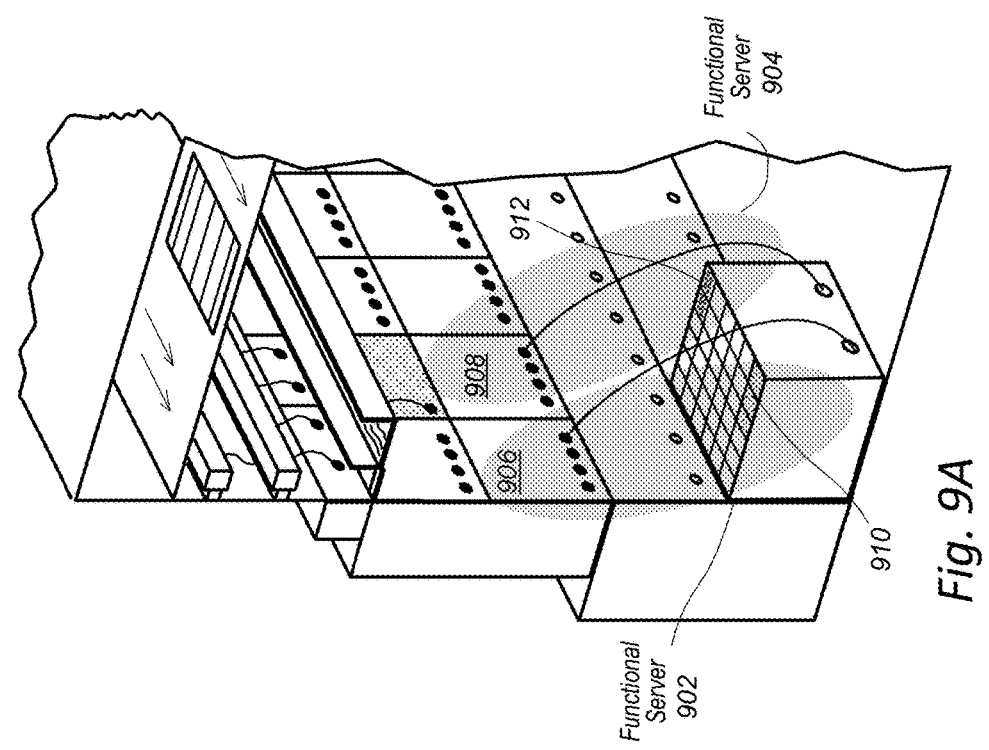
FIG. 9A illustrates server components mounted to a wall structure that are coupled together in a first configuration and that operate together as a functional server, according to some embodiments.

FIG. 9A illustrates server components mounted to a wall structure that are coupled together in a first configuration and that operate together as a functional server, according to some embodiments. Functional server 902 includes compute server component 906 coupled with storage server components 910 and functional server 904 includes compute server component 908 coupled with storage server components 912.

FIG. 9B illustrates server components coupled together in the first configurations being re-configured into a second configuration, according to some embodiments. In FIG. 9B, compute server component 914 has been coupled with compute server component 906 via a cable to increase the computing capacity of functional server 902. Also, compute server component 916 and compute server component 918 have been coupled with compute server component 908 via a cable to increase the computing capacity of functional server 904. In a similar manner additional storage server components may be coupled with computing devices that are coupled together as a functional server to increase a storage capacity of the functional server.

In some embodiments, a server component, such as a compute server component or a storage server component may be decoupled from a set of server components with which the server component is presently coupled and may be coupled with a different set of server components. This may lower a capacity of a functional server comprising the set of server components from which the server component was decoupled and may increase a capacity a functional server comprising the set of server components to which the server component is coupled. Thus existing server components mounted to a wall structure may be mixed and matched to form functional servers with varying capacities based on different combinations of server components being coupled together to form functional servers with different configurations.

Figure 10A:
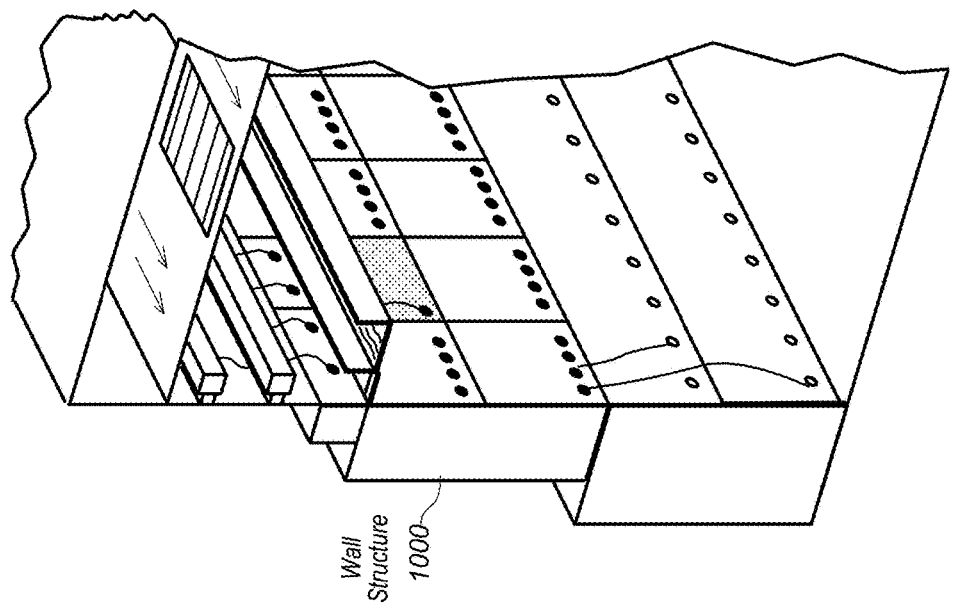
FIG. 10A illustrates a wall structure that includes server components and blanking plates covering spaces in the wall structure in which server components are not installed, according to some embodiments.

FIG. 10A illustrates a wall structure that includes server components and blanking plates covering spaces in the wall structure in which server components are not installed, according to some embodiments. As described in FIG. 8, in some embodiments a wall structure or an air containment structure may be installed in a destination location and put into operation without a full complement of server components being installed in the wall structure or the air containment structure. In such embodiments, one or more blanking plates may be installed in locations on the wall structure that do not include server components.

Wall structure 1000 includes blanking plates 1002 and 1004 installed on wall structure 1000 in locations at which server components are not installed on wall structure 1000. In some embodiments, blanking plates may be secured to a wall structure with one or more fasteners, such as bolts, and may include a gasket to seal air from leaking past the blanking plate.

In response to incremental increases in demand for computing capacity such as compute or storage capacity, blanking plates may be removed from a wall structure and server components or servers may be installed on the wall structure in place of the blanking plates.

Figure 10B:
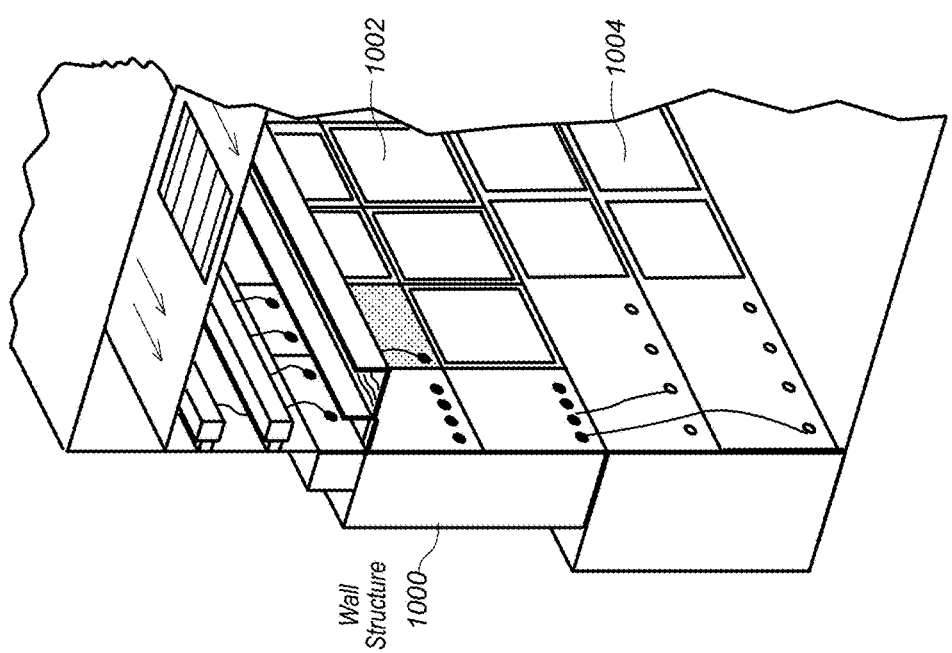
FIG. 10B illustrates server components installed in spaces in a wall structure that were previously covered with blanking plates, according to some embodiments.

FIG. 10B illustrates server components installed in spaces in a wall structure that were previously covered with blanking plates, according to some embodiments. In FIG. 10B blanking plates 1002 and 1004 have been removed and server components have been installed in wall structure 1000 in locations along the wall structure that were previously covered with blanking plates.

Figure 11:
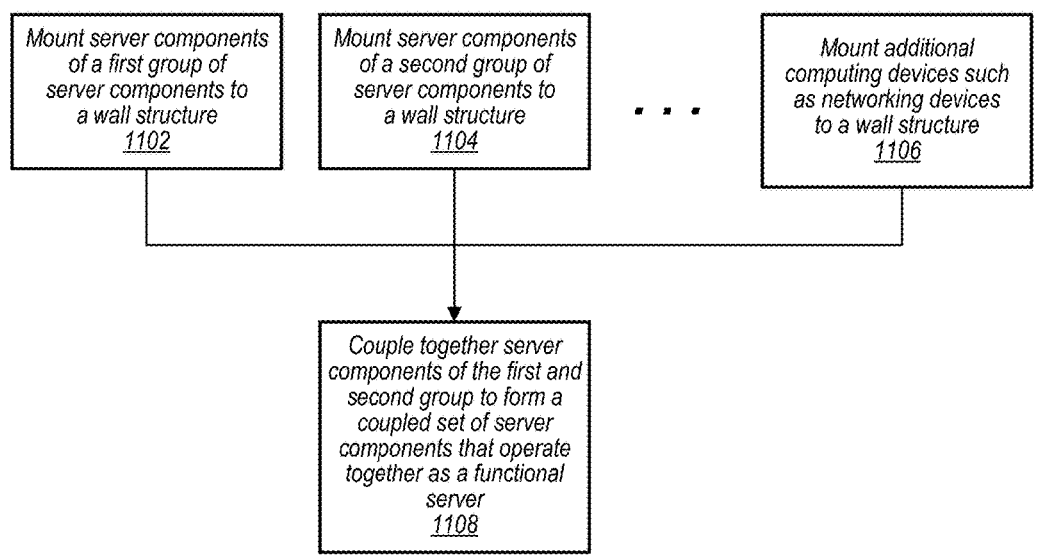
FIG. 11 illustrates a process for installing server components in a wall structure and configuring the server components into functional servers, according to some embodiments.

FIG. 11 illustrates a process for installing server components in a wall structure and configuring the server components into functional servers, according to some embodiments. At 1102 a first group of server components is mounted to a wall structure. For example, at 1102 compute server components may be mounted to a wall structure. At 1104 a second group of server components is mounted to a wall structure.

For example, at 1104 storage server components may be mounted to the wall structure. In some embodiments, any number of groups of server components may be mounted to a wall structure. For example a group of graphics processing server components, application specific integrated circuit (ASIC) server components, etc. may be mounted to the wall structure as indicated by the ellipses between 1104 and 1106. At 1106 additional computing devices such as networking devices are mounted to the wall structure. In some embodiments, 1102, 1104, and 1106 may be performed prior to a wall structure or an air containment structure being delivered to an installation location or may be performed at an installation location.

At 1108, one or more data communication coupling devices, such as cables, are used to couple together server components from different groups of server components as a set of coupled server components that operate together as a functional server. For example, multiple compute server components and multiple storage server components may be coupled together as a set of server components that operate together as a functional server.

Figure 12:
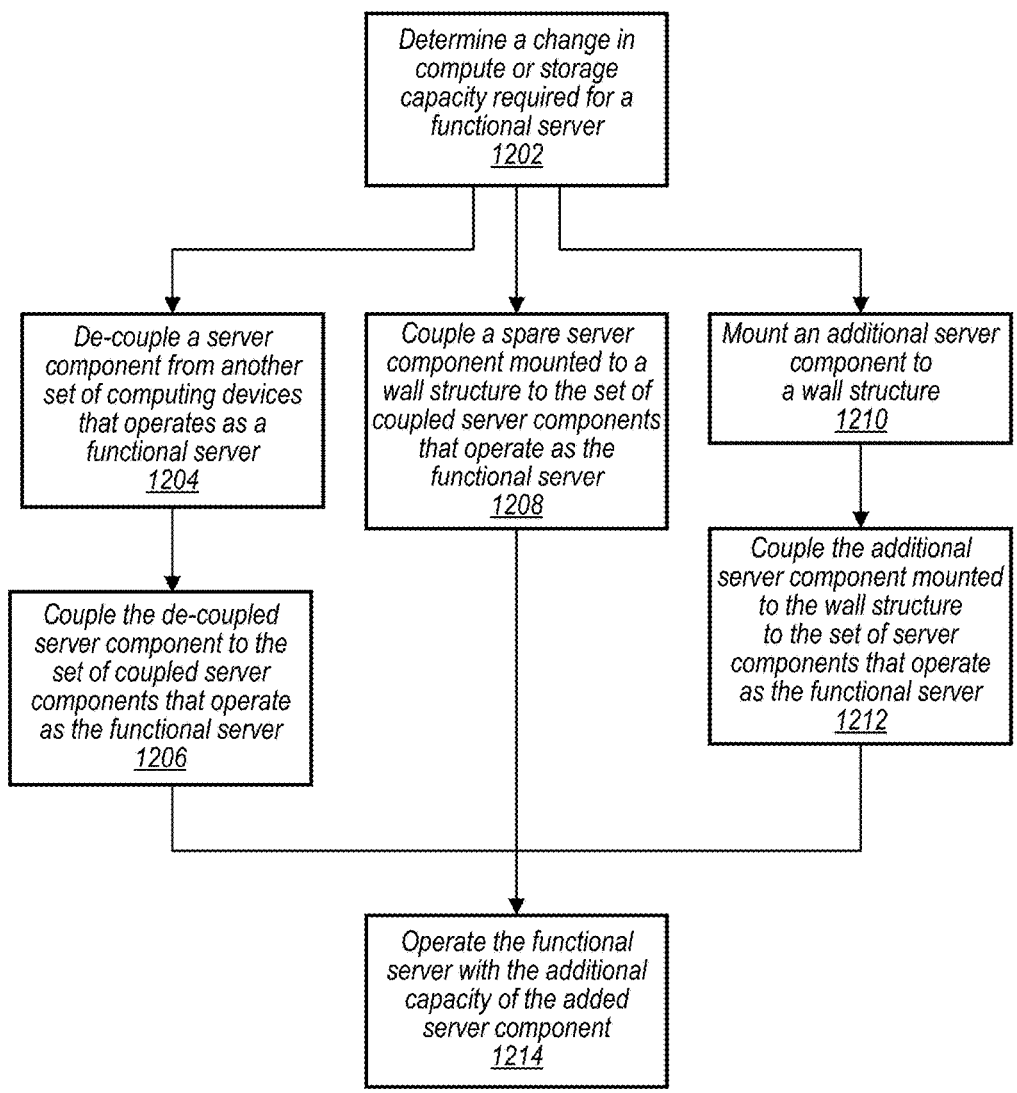
FIG. 12 illustrates reconfiguring a functional server configuration comprising server components coupled together via data communication devices, according to some embodiments.

FIG. 12 illustrates reconfiguring a functional server configuration comprising server components coupled together via data communication devices, according to some embodiments. At 1202, a change in compute, storage, or another characteristic capacity required for a functional server is determined. For example, it may be determined that a first functional server requires more compute capacity and it may be determined that a second functional server needs more storage capacity.

At 1204 a server component is decoupled from an existing set of server components that operate together as a functional server. At 1206 the de-coupled server component is coupled to another set of server components that operate together as another functional server. This may reduce the capacity of the first functional server and increase the capacity of the second functional server. For example, a compute server component may be decoupled from a functional server with excess compute capacity and may be coupled with a functional server requiring additional compute capacity.

Alternatively, at 1208 a spare server component mounted to the wall structure but not currently included in a set of coupled server components that operate together as a functional server may be coupled with the set of server components that operate together as the functional server in order to increase a capacity of the functional server. For example, a spare storage server component may be coupled with the set of coupled server components to increase a storage capacity of the functional server.

As another alternative, at 1210 an additional server component is mounted to the wall structure. For example, as described in FIG. 10, a blanking plate may be removed from a wall structure and a server component may be mounted in an open space on the wall structure previously covered by the blanking plate. At 1212 the additional server component mounted to the wall structure is coupled with the set of server components that operate together as the functional server to increase the capacity of the functional server.

At 1214, the functional server is operated with the additional capacity of the added server component. In some embodiments, server components and functional servers may be hot-swappable such that server components can be coupled to and decoupled from a set of server components that operate together as a functional server while the server components are in operation as the functional server.

Figure 13:
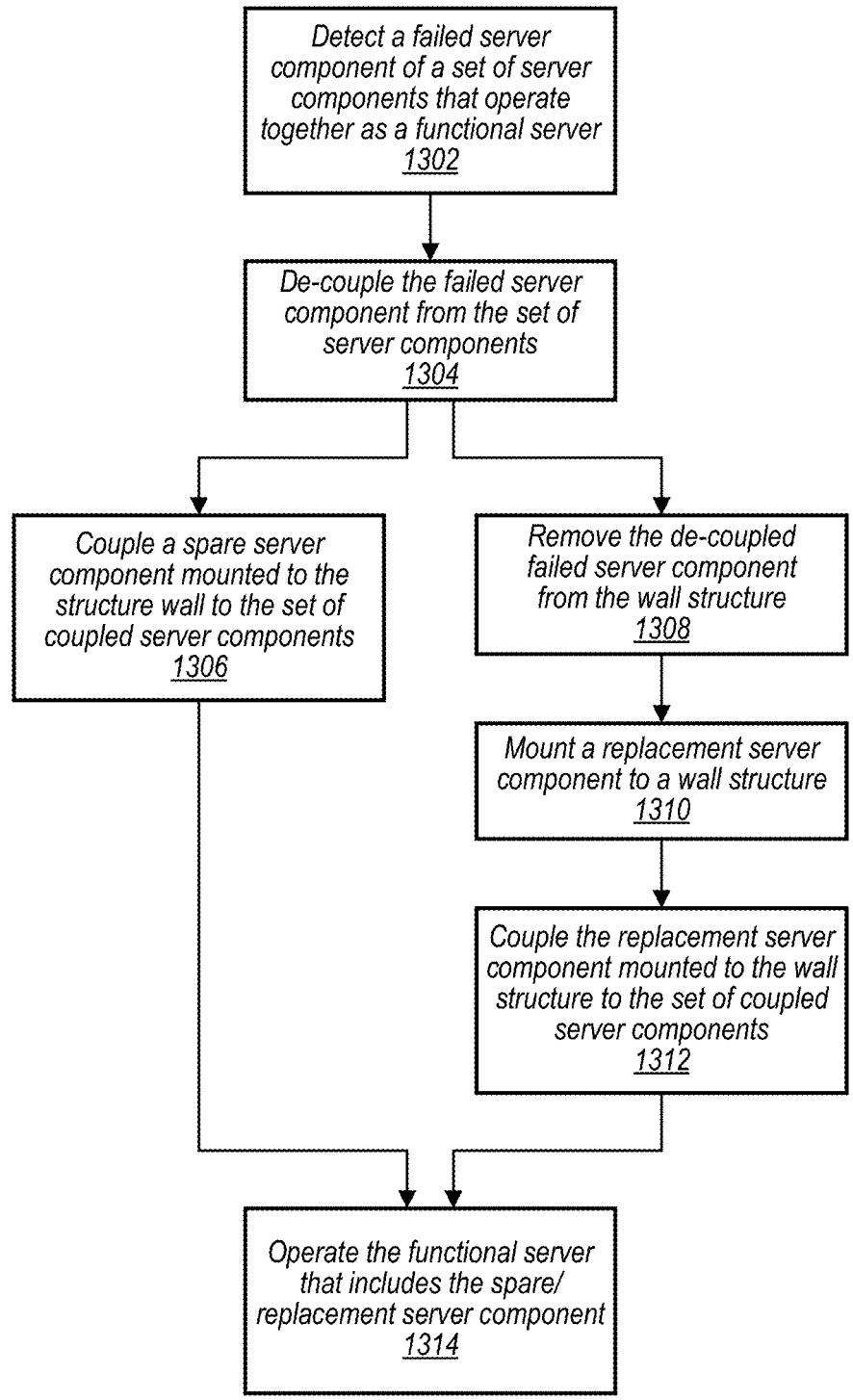
FIG. 13 illustrates replacing a failed server component included in a functional server configuration, according to some embodiments.

FIG. 13 illustrates replacing a failed server component included in a functional server configuration, according to some embodiments. At 1302 a failed server component is detected. The failed server component may be a server component of a set of server components that operate together as a functional server. At 1304, the failed server component is decoupled from the set of server components.

At 1306 a spare server component already mounted to the wall structure is coupled to the set of coupled server components to replace the failed server component.

Alternatively, at 1308 the failed server component that has been decoupled from the set of server components is removed from the wall structure. At 1310 a replacement server component is mounted to the wall structure to replace the failed server component. At 1312, the replacement server component mounted to the wall structure is coupled to the set of server components that operate together as a functional server in order to replace the failed server component.

In some embodiments, the server components may be hot swappable and 1306, 1308, 1310, or 1312 may be performed while the functional server is in operation.

At 1314, the functional server comprising the set of coupled server components coupled with the spare or replacement server component is operated as a functional server with a capacity equivalent to or greater than the capacity of the functional server prior to the failure of the server component.

The process described in FIG. 11 may improve capacity availability at a facility because a failed server component may not cause other non-failed server components to be taken out of service while the failed server component is being replaced or a spare server component is being coupled to the functional server.

Figure 14:
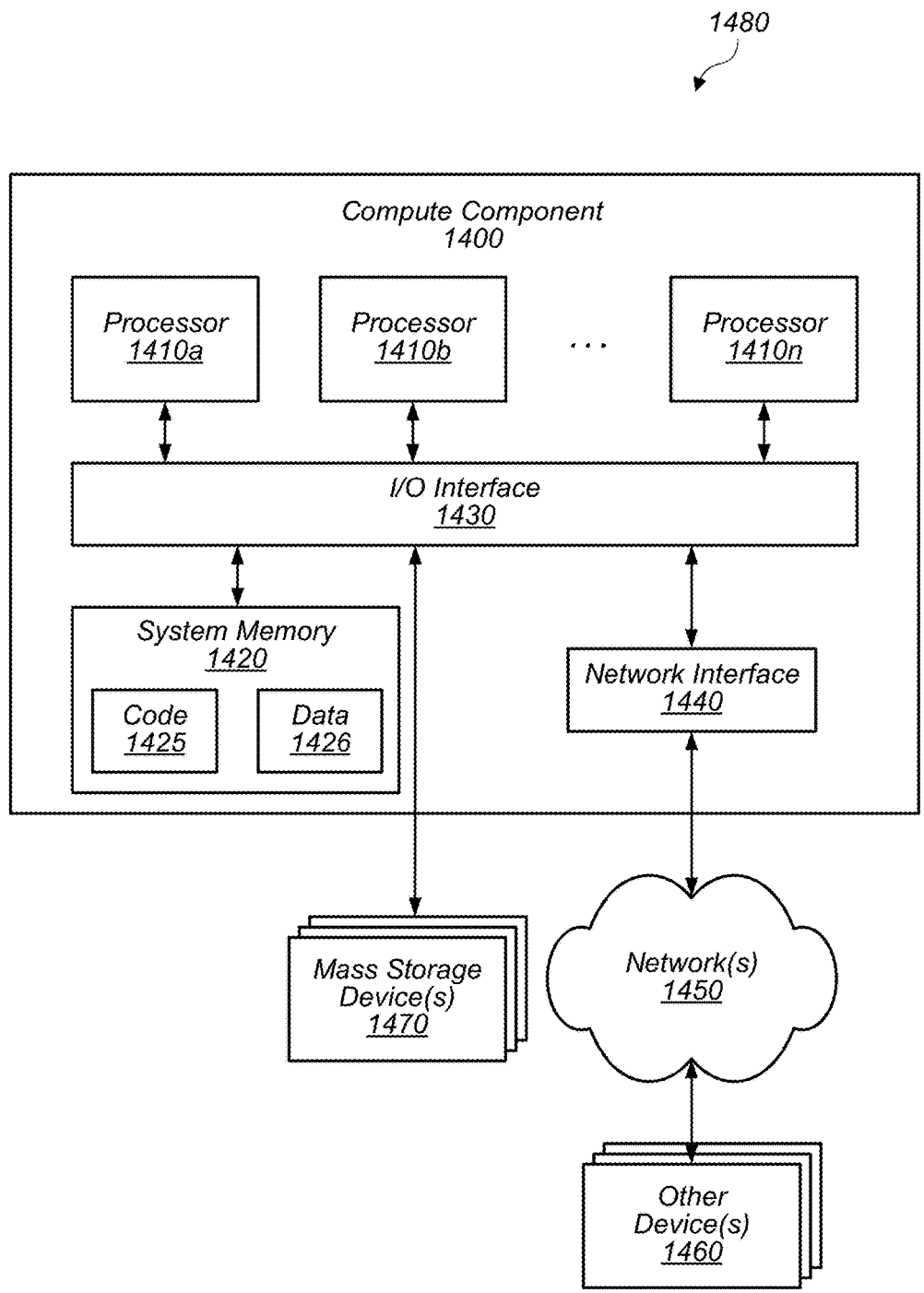
FIG. 14 illustrates a computer system that may be included in a functional server, according to some embodiments.

FIG. 14 illustrates an example computer system, such as a functional server, according to some embodiments. For example, compute component 1400 may be a compute server component, according to some embodiments, and mass storage devices 1470 may be storage server components, according to some embodiments. A computer system is configured to access one or more computer-accessible media, such as computer system 1480 illustrated in FIG. 14. In the illustrated embodiment, compute component 1400 includes one or more processors 1410 coupled to a system memory 1420 and mass storage devices 1470 via an input/output (I/O) interface 1430. Compute component 1400 further includes a network interface 1440 coupled to I/O interface 1430.

In various embodiments, compute component 1400 may be a uniprocessor system including one processor 1410, or a multiprocessor system including several processors 1410 (e.g., two, four, eight, or another suitable number). Processors 1410 may be any suitable processors capable of executing instructions. For example, in various embodiments, processors 1410 may be general-purpose or embedded processors implementing any of a variety of instruction set architectures (ISAs), such as the x86, PowerPC, SPARC, or MIPS ISAs, or any other suitable ISA. In multiprocessor systems, each of processors 1410 may commonly, but not necessarily, implement the same ISA.

System memory 1420 and mass storage devices 1470 may be configured to store instructions and data accessible by processor(s) 1410. In various embodiments, system memory 1420 and mass storage devices 1470 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are stored within system memory 1420 or mass storage devices 1470 as code 1425 and data 1426.

In one embodiment, I/O interface 1430 may be configured to coordinate I/O traffic between processor 1410, system memory 1420, mass storage devices 1470, and any peripheral devices in the device, including network interface 1440 or other peripheral interfaces. In some embodiments, I/O interface 1430 may perform any necessary protocol, timing or other data transformations to convert data signals from one component (e.g., system memory 1420 or mass storage device 1470) into a format suitable for use by another component (e.g., processor 1410). In some embodiments, I/O interface 1430 may include support for devices attached through various types of peripheral buses, such as a variant of the Peripheral Component Interconnect Express (PCIe) bus standard or the Universal Serial Bus (USB) standard, for example. In some embodiments, the function of I/O interface 1430 may be split into two or more separate components, such as a north bridge and a south bridge, for example. Also, in some embodiments some or all of the functionality of I/O interface 1430, such as an interface to system memory 1420 or mass storage devices 1470, may be incorporated directly into processor 1410.

Network interface 1440 may be configured to allow data to be exchanged between computer system 1400 and other devices 1460 attached to a network or networks 1450, such as other computer systems or devices as illustrated in FIGS. 1 through 13, for example. In various embodiments, network interface 1440 may support communication via any suitable wired or wireless general data networks, such as types of Ethernet network, for example. Additionally, network interface 1440 may support communication via telecommunications/telephony networks such as analog voice networks or digital fiber communications networks, via storage area networks such as Fibre Channel SANs, or via any other suitable type of network and/or protocol.

In some embodiments, system memory 1420 or mass storage devices 1470 may be one embodiment of a non-transitory computer-accessible medium configured to store program instructions and data for implementing a particular processing system. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to compute component 1400 via I/O interface 1430. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 1480 as system memory 1420, mass storage devices 1470, or another type of memory. Further, a computer-accessible medium may include transmission media or signals such as electrical, electromagnetic, or digital signals, conveyed via a communication medium such as a network and/or a wireless link, such as may be implemented via network interface 1440.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    a wall structure extending along an aisle of the data center, wherein the wall structure comprises mounting brackets configured to mount computing devices to the wall structure;
    computing devices mounted to the wall structure via the mounting brackets, wherein the computing devices comprise:
        a group of compute server components mounted to the wall structure; and
        a group of storage server components mounted to the wall structure; and
    data communication coupling devices configured to couple together respective ones of the compute server components and respective ones of the storage server components as respective sets of coupled server components, wherein each set of the respective sets of coupled server components is configured such that the coupled server components of the respective set operate together as a respective functional server;
    wherein the data communication coupling devices and the compute server components mounted to the wall structure and the storage server components mounted to the wall structure are configured to permit the compute and storage server components to be coupled together and decoupled from one another to form different configurations of the respective sets of coupled server components that operate together as respective functional servers;
    wherein the respective sets of coupled server components that operate together as respective functional servers are not mounted together in a common server chassis.

2. The data center of claim 1, wherein the computing devices are mounted to the wall structure and supported by the wall structure without server racks.

3. The data center of claim 1, wherein:
    a first set of the sets of coupled server components comprises:
        a compute server component, of the group of compute server components, mounted to the wall structure via a first mounting bracket in a first location on the wall structure, and
        a storage server component, of the group of storage server components, mounted to the wall structure via a second mounting bracket in a second location on the wall structure; and
    a second set of the sets of coupled server components comprises:
        another compute server component, of the group of compute server components, mounted to the wall structure via a third mounting bracket in a third location on the wall structure, and
        another storage server component, of the group of storage server components, mounted to the wall structure via a fourth mounting bracket in a fourth location on the wall structure.

4. The data center of claim 1, wherein the group of compute server components are mounted to the wall structure at a higher elevation on the wall structure than an elevation on the wall structure at which the storage server components are mounted to the wall structure, wherein the compute server components and the storage server components are configured to be cooled by an air flow.

5. The data center of claim 4, wherein the data center further comprises:
    power supplies configured to supply power to the server components,
    wherein the power supplies are mounted to the wall structure at a higher elevation on the wall structure than the elevation at which the compute server components are mounted to the wall structure and at a higher elevation on the wall structure than the elevation at which the storage server components are mounted to the wall structure.

6. An apparatus, comprising:
    a wall structure comprising:
        a first set of mounting brackets configured to mount a first group of server components to the wall structure;
        a second set of mounting brackets configured to mount a second group of server components to the wall structure,
        wherein the first group of server components and the second group of server components comprise different types of server components; and
    communication coupling devices configured to couple together respective server components of the first group of server components mounted to the wall structure with respective server components of the second group of server components mounted to the wall structure such that respective sets of the coupled server components operate together as respective functional servers
    wherein the respective sets of coupled server components that operate together as respective functional servers are not mounted together in a common server chassis.

7. The apparatus of claim 6, wherein the first set of mounting brackets and the second set of mounting brackets are configured to respectively mount the first and second groups of server components to the wall structure without the first or second groups of server components being mounted in a common server chassis.

8. The apparatus of claim 6, wherein the first set of mounting brackets and the second set of mounting brackets are configured to support the first and second groups of server components without a server rack supporting the first and second groups of server components.

9. The apparatus of claim 6, wherein the first set of mounting brackets for the first group of server components and the second set of mounting brackets for the second group of server components are arranged vertically on the wall structure based on respective amounts of waste heat generated by the server components of the first group of server components and the server components of the second group of server components.

10. The apparatus of claim 6, further comprising:
the first group of server components mounted in the first set of mounting brackets, wherein the first group of server components comprise compute server components;
the second group of server components mounted in the second set of mounting brackets, wherein the second group of server components comprise storage server components,
wherein one of the communication coupling devices couples together a compute server component of the first group of server components and a storage server component of the second group of server components in a set of coupled server components that operate together as one of the respective functional servers.

11. The apparatus of claim 10, wherein another one of the communication coupling devices couples together other server components of the first group of server components and the second group of server components as another set of coupled server components that operate together as another one of the respective functional servers,
wherein the other set of coupled server components that operate together as the other one of the respective functional servers and the set of coupled server components that operate together as the one of the respective functional servers comprise different ratios of compute server components to storage server components.

12. The apparatus of claim 10 further comprising:
a networking device mounted to the wall structure via one of the mounting brackets of the wall structure,
wherein the networking device is configured to couple with multiple ones of the respective sets of coupled server components that operate together as respective functional servers and perform network operations associated with the respective functional servers.

13. The apparatus of claim 10, wherein the first group of server components and the second group of server components comprise hot-swappable server components that are configured to be serviced from a front side of the wall structure, wherein the front side of the wall structure extends along a cold aisle in a computing facility.

14. The apparatus of claim 13, wherein the communication coupling devices are accessible from the front side of the wall,
wherein the communication coupling devices and the first and second groups of server components are configured to permit the server components of the first and second group of server components to be coupled together and decoupled from one another to form different configurations of the respective sets of coupled server components that operate together as respective functional servers, wherein a ratio of compute server components to storage server components of the different configurations is based on computing and storage requirements for the respective functional servers.

15. A method comprising:
mounting server components of a first group of server components to a wall structure via a first set of mounting brackets of the wall structure;
mounting server components of a second group of server components to the wall structure via a second set of mounting brackets of the wall structure, wherein the first group of server components and the second group of server components comprise different types of server components; and
coupling together one of the server components of the first group of server components and one of the server components of the second group of server components to form a coupled set of server components that operate together as a functional server, wherein the set of coupled server components that operate together as the functional server are not mounted together in a common server chassis.

16. The method of claim 15, wherein the first group of server components and the second group of server components are mounted to the wall structure in a vertical arrangement based on respective amounts of waste heat generated by the server components of the first group of server components and the second group of server components.

17. The method of claim 15, wherein the first group of server components comprises compute server components and wherein the second group of server components comprises storage server components, wherein the method further comprises:
coupling together other ones of the first group of server components and other ones of the second group of server components to form another set of server components that operate together as another functional server,
wherein the set of server components and the other set of server components comprise different ratios of compute server components to storage server components based on respective compute and storage requirements of the functional server and the other functional server.

18. The method of claim 17, further comprising:
decoupling a compute server component or a storage server component from the set of coupled storage components that operate together as the functional server; and
coupling the decoupled compute server component or the decoupled storage server component to the other set of coupled storage components that operate together as the other functional server.

19. The method of claim 15, further comprising:
decoupling a failed server component from the set of coupled server components that operate together as the functional server while other ones of the server components of the set of coupled server components continue to operate together as the functional server; and
coupling another server component mounted to the wall structure to the set of coupled server components; or
removing the failed server component from the mounting bracket of the wall structure and mounting a replacement server component in the mounting bracket of the wall structure and coupling the replacement server component to the set of coupled server components.

20. The method of claim 19,
wherein said decoupling the failed server component and said coupling the other server component are performed via a front side of the wall structure extending along a cold aisle in a computing facility; or
wherein said removing the failed server component, said mounting the replacement server component, and said coupling the replacement server component are performed via a front side of the wall structure extending along a cold aisle in a computing facility.

* * * * *